(12) United States Patent
Böck et al.

(10) Patent No.: US 7,719,088 B2
(45) Date of Patent: May 18, 2010

(54) HIGH-FREQUENCY BIPOLAR TRANSISTOR

(75) Inventors: Josef Böck, München (DE); Thomas Meister, Taufkirchen (DE); Reinhard Stengl, Stadtbergen (DE); Herbert Schäfer, Höhenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 49 days.

(21) Appl. No.: 11/254,502

(22) Filed: Oct. 20, 2005

(65) Prior Publication Data

US 2006/0038258 A1    Feb. 23, 2006

Related U.S. Application Data

(63) Continuation of application No. PCT/EP2004/050335, filed on Mar. 19, 2004.

(30) Foreign Application Priority Data

Apr. 23, 2003   (DE) ................ 103 18 422

(51) Int. Cl.
*H01L 29/72* (2006.01)
(52) U.S. Cl. ........... 257/587; 257/586; 257/E29.026
(58) Field of Classification Search ......... 257/586–588, 257/E29.034, 587, E29.114, 557, E29.026, 257/E29.044
See application file for complete search history.

(56) References Cited

U.S. PATENT DOCUMENTS

| | | | |
|---|---|---|---|
| 4,979,010 A | 12/1990 | Brighton | |
| 5,177,582 A * | 1/1993 | Meister et al. | ............. 257/588 |
| 5,345,097 A * | 9/1994 | Nakagawa | ............. 257/198 |
| 5,596,221 A | 1/1997 | Honda | |
| 5,665,614 A * | 9/1997 | Hafizi et al. | ............. 438/320 |
| 5,773,350 A | 6/1998 | Herbert et al. | |
| 5,821,149 A | 10/1998 | Schüppen et al. | |
| 6,455,364 B1 | 9/2002 | Asai et al. | |
| 6,551,891 B1 | 4/2003 | Chantre et al. | |
| 6,627,972 B1 | 9/2003 | Ehwald et al. | |

(Continued)

FOREIGN PATENT DOCUMENTS

DE    196 09 933 A1    9/1997

(Continued)

OTHER PUBLICATIONS

Chih-Fang Huang and James A. Cooper Jr., *4H-SiC npn Bipolar Junction Transistors with $BV_{CEO}>3{,}200\ V$*, pp. 57-60, IEEE 2002.

(Continued)

*Primary Examiner*—Allan R Wilson
(74) *Attorney, Agent, or Firm*—Brinks Hofer Gilson & Lione

(57) ABSTRACT

A high-frequency bipolar transistor includes an emitter contact adjoining an emitter connection region, a base contact adjoining a base connection region, and a collector contact adjoining a collector connection region. A first insulation layer is disposed on the base connection region. The collector connection region contains a buried layer, which connects the collector contact to a collector zone. A silicide or salicide region is provided on the buried layer and connects the collector contact to the collector zone in a low-impedance manner. A second insulation layer is disposed on the collector connection region but not on the silicide region.

12 Claims, 4 Drawing Sheets

U.S. PATENT DOCUMENTS

| | | | |
|---|---|---|---|
| 6,635,545 B2 | 10/2003 | Böck et al. | |
| 2002/0149062 A1 | 10/2002 | Nii et al. | |
| 2002/0168829 A1 | 11/2002 | Bock et al. | |
| 2003/0011000 A1* | 1/2003 | Watanabe et al. | 257/197 |
| 2004/0214401 A1* | 10/2004 | Krueger et al. | 438/317 |

FOREIGN PATENT DOCUMENTS

| | | |
|---|---|---|
| DE | 689 27 787 T2 | 12/1998 |
| DE | 198 42 106 | 3/2000 |
| DE | 199 58 062 A1 | 7/2001 |
| EP | 0 337 720 B1 | 10/1998 |

OTHER PUBLICATIONS

Masao Kondo, *Variation in Emitter Diffusion Depth by TiSi$_2$ Formation on Polysilicon Emitters of Si Bipolar Transistors*, pp. 2108-2117, IEEE Transactions on Electron Devices, vol. 48, No. 9, Sep. 2001.

International Search Report from corresponding International Application No. PCT/EP2004/050335.

\* cited by examiner

HIGH-FREQUENCY BIPOLAR TRANSISTOR

PRIORITY CLAIM

This application is a continuation of International Application PCT/EP2004/050335, filed on Mar. 19, 2004, which claims the benefit of priority to German Patent Application DE 10 2003 10318422.8 filed on Apr. 23, 2003, both of which are herein incorporated by reference in their entirety.

TECHNICAL FIELD

The invention relates to a bipolar transistor. More specifically, this invention relates to a high-frequency bipolar transistor.

BACKGROUND

Bipolar transistors are transistors used in high-frequency applications. The frequency response of a bipolar transistor is given by (1):

$$\frac{1}{2\pi f_T} = \tau_f + (R_C + R_E)C_{BC} + \frac{C_{BE} + C_{BC}}{I_C}U_T \quad (1)$$

where $f_T$ is the transition frequency, $\tau_f$ is the transit time across the base, $R_C$ is the collector resistance, $R_E$ is the emitter resistance, $C_{BC}$ is the base-collector capacitance, $C_{BE}$ is the base-emitter capacitance, $I_C$ is the collector current and $U_T$ is the thermal voltage.

As the collector current $I_C$ increases, the term proportional to $1/I_C$ becomes smaller and smaller. The principal proportion of the transition frequency $f_T$ is therefore given, besides the transit time $\tau_f$, in particular by the collector resistance $R_C$ and the emitter resistance $R_E$. In present transistors, the collector resistance $R_C$ is typically an order of magnitude greater than the emitter resistance $R_E$. Therefore, the collector resistance is minimized to increase the frequency response of the transistors.

In order to obtain a low-impedance collector connection, a highly doped buried layer is used. This layer is produced at the beginning of the transistor fabrication steps. After this layer is fabricated, a semiconductor layer in which the emitter, base and collector zones are produced is grown epitaxially on the low-impedance layer. The highly doped buried layer is connected by means of a metallic collector contact and led to the surface of the bipolar transistor. This is described for example in U.S. Pat. No. 5,773,350 and DE 19958062.

In general, a collector contact is provided on only one side of the transistor. If the buried layer is connected not just on one side but also on the opposite side or even annularly around the entire transistor zone, lower collector resistances may be obtained. Such transistor configurations have a resistance with a magnitude about a half or a quarter that of a configuration having only a single collector contact, since the collector current can flow not just toward one side, but toward two or four sides.

FIG. 1 shows a schematic cross-sectional view of a known bipolar transistor 1 in which a buried layer 7 bounded by two insulation zones 11 is arranged in the semiconductor substrate 12. The insulation zones 11 are configured as deep trenches. The buried layer 7 is connected externally via a collector contact 6, which is led out electrically to the surface of the bipolar transistor 1. This enables the bipolar transistor 1 to be integrated into an integrated circuit.

The bipolar transistor 1 also contains a base contact 4 and an emitter contact 2 adjoining an emitter connection region 3. In order to reduce the base resistance, as illustrated in FIG. 1, a silicided base connection region 13 is provided on a base connection region 5. The base connection region 13 connects the base contact 4 to the base connection region 5. Such a bipolar transistor 1 is described in DE 199 58 062 by way of example.

The base zone 15 beneath the emitter connection region 3 may be silicon-germanium SiGe with a thickness of between 1 nm and 200 nm, typically 30 nm. The collector zone 14 is arranged beneath the base zone 15 and adjoins the buried layer 7. The buried layer 7 is provided with a collector contact 6 only on one side of the bipolar transistor 1 as shown in FIG. 1.

FIG. 2 schematically shows a plan view of a bipolar transistor in which the buried layer 7 is provided with a collector contact 6 on a single side. The base connection region 5 is connected by a base contact 4, and the emitter connection region 3 is connected by an emitter contact 2. In such a configuration, although the bipolar transistor 1 has a small area determined by the extent of the buried layer 7, the collector region (not illustrated here), on account of the relatively large sheet resistance of the buried layer 7, is connected by the collector contact 6 only on one side.

Smaller collector resistances can be obtained by the buried layer 7 being connected not just on one side, as in FIG. 2, but also on the opposite side, as shown schematically in a plan view in FIG. 3. The bipolar transistor 1 from FIG. 3 has a resistance with a magnitude about half that of the bipolar transistor 1 from FIG. 2.

However, it becomes clear that the area occupied by the buried layer 7 in FIG. 3 is larger than the buried layer 7 of the bipolar transistor from FIG. 2. The additionally required area of the buried layer 7 results from the width X1 of the collector contact 6, the distance X2 between the collector contact 6 and the base connection region 5, and an overhang X4 of the buried layer 7. The overhang X4 in FIG. 3 represents the distance between the collector contact 6 and the closest edge of the buried layer 7.

This additionally required area is given by the available photolithography and alignment tolerances. Typical contact hole widths in photolithography are presently 0.5 µm, for example, with alignment tolerances of 0.25 µm, so that overall the buried layer 7 is widened by about 1 µm if an additional collector contact 6 is provided.

Even lower sheet resistances of the buried layer 7 are obtained if, as shown schematically in FIG. 4, the collector contact 6 and the buried layer 7 are provided annularly around the base connection region 5. In this case, the collector current can flow on four sides, as a result of which the collector connection resistance is quartered. However, these enlarged collector contacts 6 lead to significantly enlarged dimensions of the bipolar transistor 1. In addition to increased production costs on account of the larger area required in the semiconductor substrate, the collector-substrate capacitance of the bipolar transistor 1 is also increased proportionally to the increasing area of the buried layer 7. This leads to a longer gate delay time of the transistor or an increased power consumption of integrated circuits.

Therefore, what transistor configuration has been used heretofore has depended on whether the transistor is designed for maximum transition frequency, as described with reference to FIG. 4, least space requirement, as described with reference to FIG. 2, or a compromise between the two, as described with reference to FIG. 3.

In summary, such transistors entail significant disadvantages. Firstly, the transistor dimensions are enlarged by the additional collector contact zones. This leads to higher production costs on account of the larger substrate area required. Secondly, the collector-substrate capacitance of the bipolar transistor is also increased proportionally to the increasing area of the buried layer. This in turn leads to adverse effects, such as a higher gate delay time or increased power consumption of integrated circuits.

SUMMARY

By way of introduction only, a high-frequency bipolar transistor and fabrication method are described. In one embodiment, the high-frequency bipolar transistor comprises an emitter contact adjoining an emitter connection region, a base contact adjoining a base connection region, and a collector contact adjoining a collector connection region. The connector connection region includes a buried layer. The buried layer connects the collector contact to a collector zone. A silicide or salicide region is provided on the buried layer and connects the collector contact to the collector zone in a low-impedance manner.

In one embodiment, the high-frequency bipolar transistor comprises he high-frequency bipolar transistor comprises an emitter contact adjoining an emitter connection region, a base contact adjoining a base connection region, and a collector contact adjoining a collector connection region. A first insulation layer is disposed on the base connection region. The connector connection region includes a buried layer. The buried layer connects the collector contact to a collector zone. A silicide or salicide region is provided on the buried layer and connects the collector contact to the collector zone in a low-impedance manner. A second insulation layer is disposed on the collector connection region but not on the silicide region.

In another embodiment, a method for fabricating a high-frequency bipolar transistor is presented. The method comprises: forming a collector connection region; forming a collector zone on the collector connection region, the collector connection region containing a buried layer; forming a first insulation layer on the collector connection region; forming a base zone on the collector zone; forming a base connection region and an emitter connection region on the base zone; forming a second insulation layer on the base connection region; removing at least a portion of the first insulation layer as far as the buried layer; and forming a silicide region on the buried layer before fabricating an emitter contact, a base contact, or a collector contact, the silicide region formed such that the collector contact is connected to the collector zone in a low-impedance manner.

The foregoing summary has been provided only by way of introduction. Nothing in this section should be taken as a limitation on the following claims, which define the scope of the invention.

BRIEF DESCRIPTION OF THE FIGURES

The application will be described below in greater detail on the basis of preferred embodiments and with reference to the accompanying drawings, in which.

DETAILED DESCRIPTION

A small high-frequency bipolar transistor is presented which has a low collector resistance and thus a high transition frequency. Such a high-frequency bipolar transistor has a silicide region on a buried layer. The silicide region connects the collector contact to the collector zone in a low-impedance manner. This reduces the collector resistance as the collector zone of the bipolar transistor is virtually connected from all sides even though a collector contact is provided only on one side.

The siliciding or formation of the silicide region reduces the collector resistance and typically brings about a reduction of the sheet resistance from about 100 ohm/sq of a 100 nm thick doped polysilicon layer to about 1 ohm/sq. In comparison with this, the sheet resistance of a doped silicon layer having a corresponding thickness (a few µm) is about 10 ohm/sq and a metal layer lies in the mohm/sq range. Thus, the silicide region reduces the sheet resistance of the buried layer and the collector connection resistance up to about one order of magnitude. The sheet resistance is then low enough so that even when contact is made with the buried layer on only a single side of the transistor, the collector connection region is connected in a low-impedance manner virtually from all sides by means of the silicide region.

The silicide region typically contains at least one transition metal. The transition metal used may be titanium, cobalt, nickel, platinum or tantalum, for example, which form a corresponding transition silicide with silicon. The same metal as is required anyway in the overall process for siliciding other zones such as e.g. the base connection region or source, drain and gate zones of CMOS transistors is preferably used for the siliciding. Consequently, the transition metal for forming the silicide region can be integrated into the transistor without additional costs. In one example, the silicide region contains titanium or cobalt. These transition metals ensure a particularly low sheet resistance of the buried layer. A metal that yields a minimum sheet resistance may be thus chosen.

The transition metal forms the corresponding transition metal silicide with silicon. A transition metal that yields a minimum sheet resistance of the buried layer is typically chosen.

Figure 5:
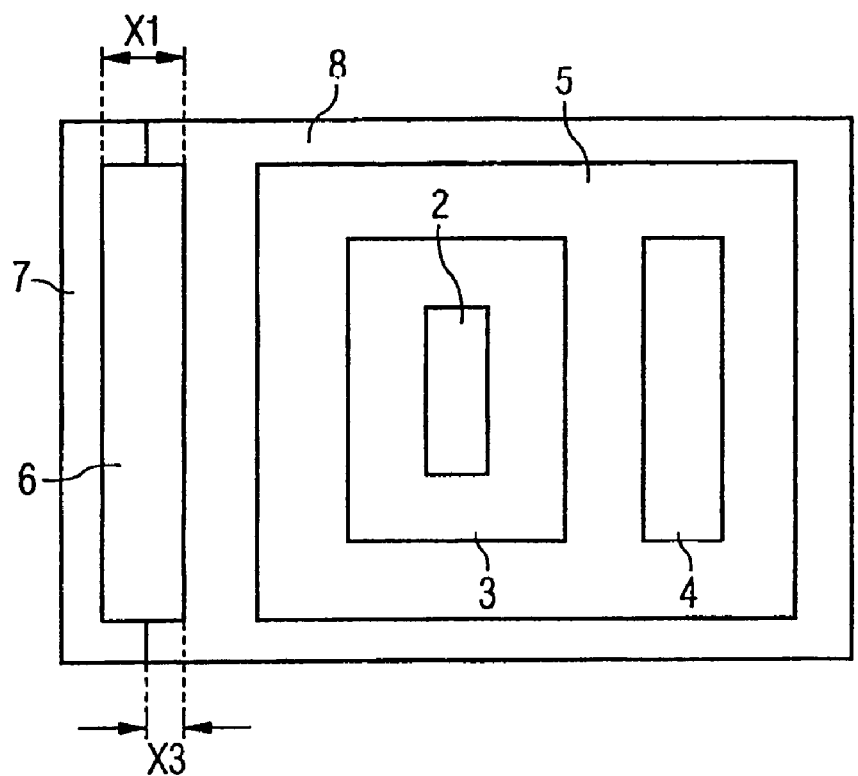
FIG. 5 shows a schematic plan view of a bipolar transistor according to the invention with a buried layer silicided in annular fashion, self-aligned with respect to the base connection region.

The bipolar transistor 1 shown in FIG. 5 has both a low collector resistance, and hence a high transition frequency, and a small area. The plan view shows that the silicide region 8 extends around the base connection region 5. In FIG. 5, the width X3 of the overlap region between the collector contact 6 and the silicide region 8 is less than the width X1 of the collector contact 6.

The width X3 of the overlap region and the width X1 of the collector contact 6 are typically equal in magnitude. The collector contact 6 can thus cover the silicide region 8 with its entire cross section. The collector contact is also connected to the silicide region 8 when alignment inaccuracies occur.

Figure 6:
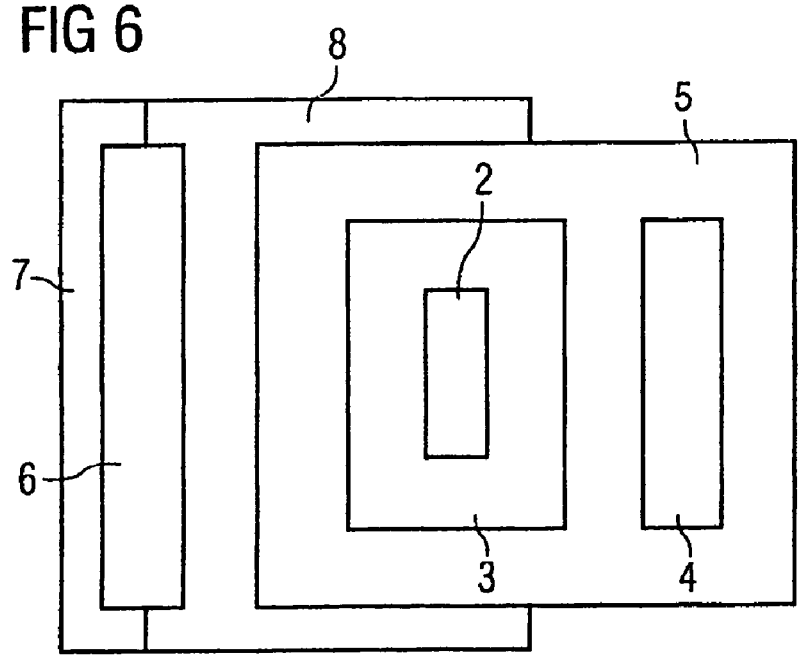
FIG. 6 shows a schematic plan view of a bipolar transistor according to the invention with a partly silicided buried layer, self-aligned with respect to the base connection region.

Furthermore, the buried layer 7, on the side of the collector contact 6 which is remote from the base connection region 5, may remain unsilicided, as shown in FIGS. 5 and 6. This may be advantageous if other components that are not intended to be silicided are situated very near. An auxiliary mask that prevents the siliciding can then be chosen to be smaller than in the case where the buried layer 7 is completely silicided, that is if the silicide region 8 extends on the entire area of the buried layer 7. This reduces the possible minimum distance between the components and hence the required area of integrated circuits.

The silicide region 8 has a sheet resistance in the ohm range. The sheet resistance of the buried layer 7 is thus decreased such that, even in the case of a metal contact-connection of the buried layer 7 with the aid of the collector contact 6 on only a single side of the bipolar transistor 1, the collector zone is effectively connected in low-impedance fashion from all sides by means of the silicide region 8.

It is not necessary in this case for the silicide region 8 to be led as a closed ring with respect to the collector contact 6. A significant reduction of the collector resistance already results if the buried layer 7 is silicided, for example only as far as the end sides of the bipolar transistor 1, as is shown in a schematic plan view with reference to FIG. 6. Here, the silicide region 8 extends at least to the level of the emitter contact 2.

Figure 1:
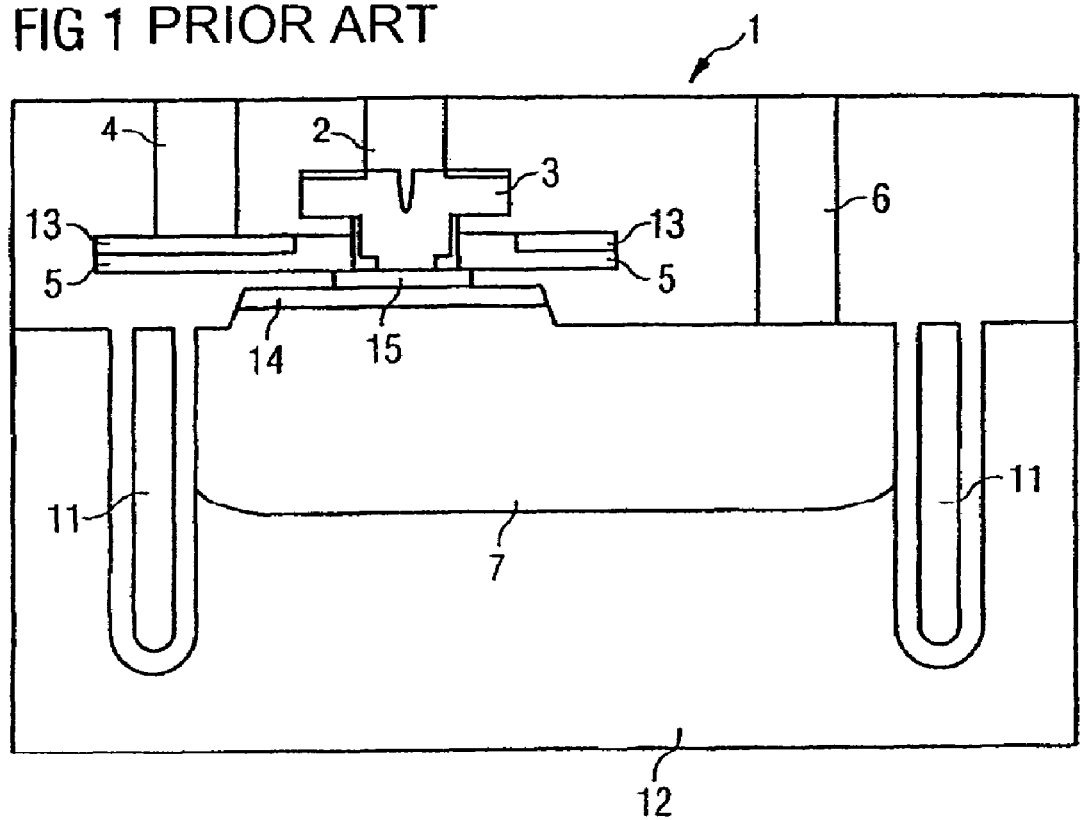
FIG. 1 shows a schematic cross-sectional view of a known bipolar transistor.
Figure 2:
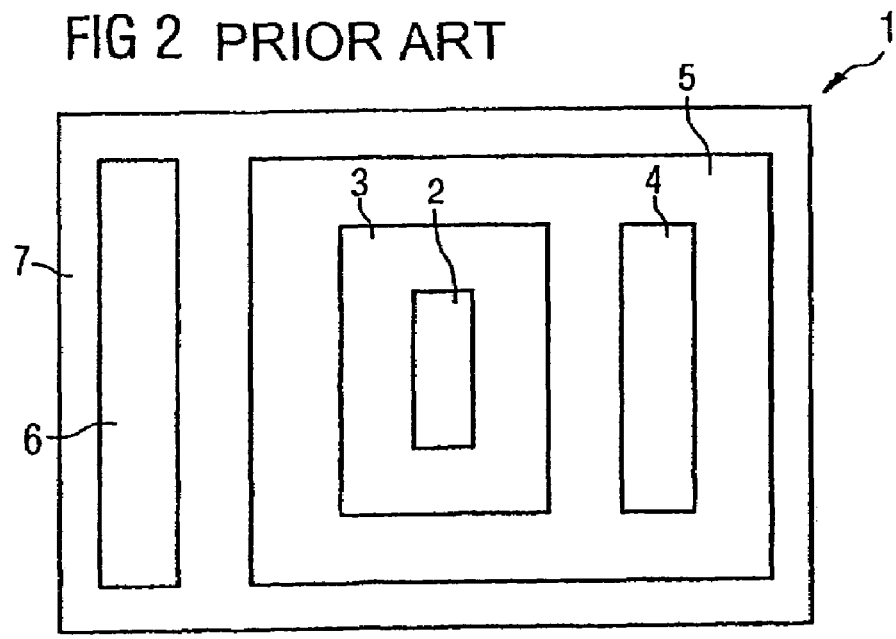
FIG. 2 shows a schematic plan view of a known bipolar transistor in which the buried layer is provided with a collector contact on one side.
Figure 3:
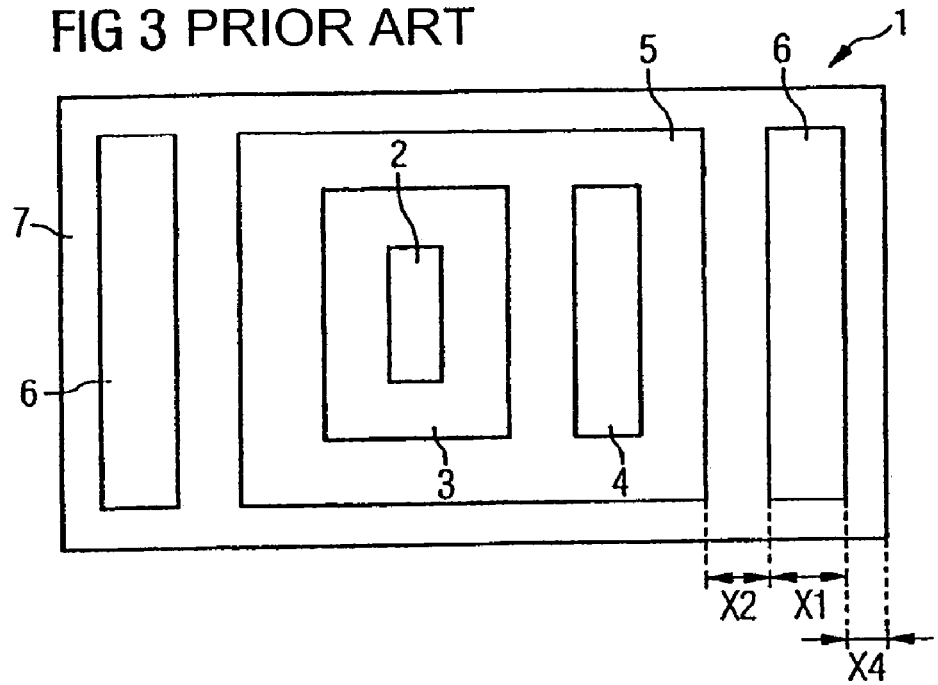
FIG. 3 shows a schematic plan view of a known bipolar transistor in which the buried layer is provided with a collector contact on two sides.
Figure 4:
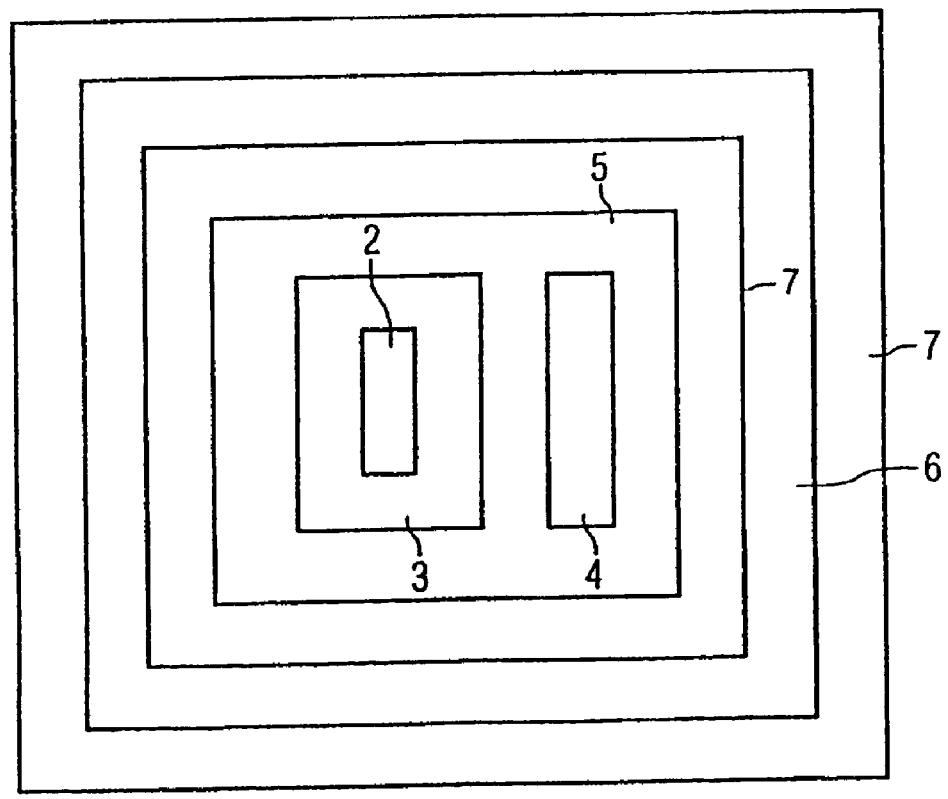
FIG. 4 shows a schematic plan view of a known bipolar transistor in which the buried layer is provided with a collector contact annularly around the transistor.

This configuration may be favorable for example if, as shown with reference to FIG. 1, the base connection region 5 is partly led via an insulation zone such as a trench. The transistor dimensions can thus be kept as small as possible.

For the bipolar transistor 1 according to the invention, the silicide region 8 may cover the entire buried layer 7 that is not covered by the base connection region 5. Regions of the buried layer 7 remain unsilicided as long as there is a continuous connection from the silicide region 8 to the collector contact 6.

Figure 7:
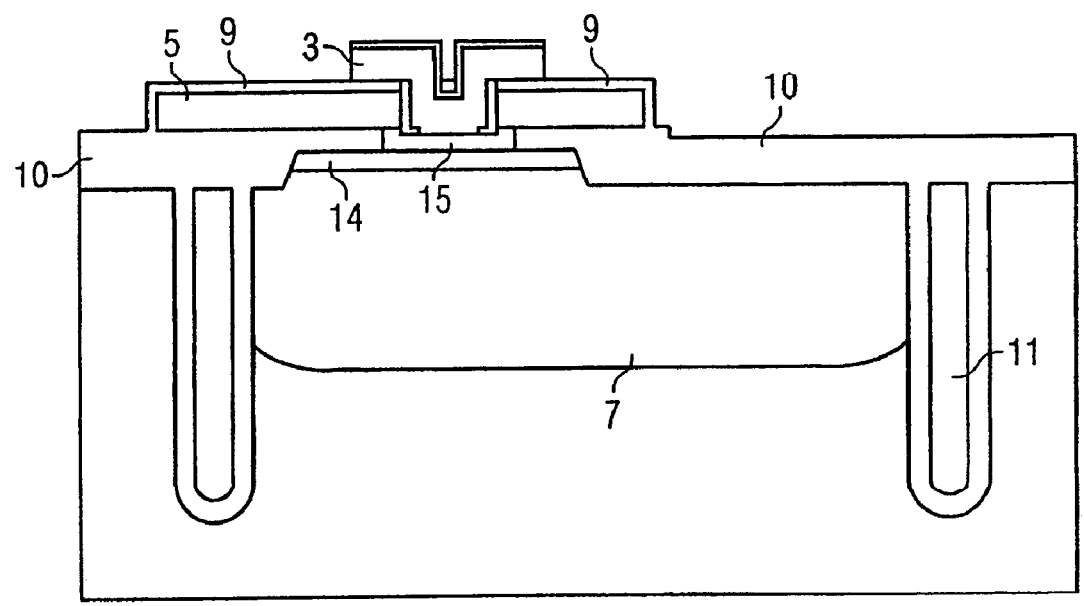
FIG. 7 shows a schematic cross-sectional view of a bipolar transistor after the patterning of the emitter connection region.

A description is given below, with reference to FIGS. 7 and 8, of how a silicide region 8 is produced in a self-aligned manner with respect to the base connection region 5, without significant additional outlay in comparison with known production methods. As shown, a silicide region is formed only on silicon; regions such as e.g. silicon oxide or silicon nitride are not silicided. This is called a "salicide method" (salicide=self-aligned silicide), in which the position of the silicide region on the buried layer takes place without the aid of photolithography. This means that the silicide region can be kept relatively small, for example in the range of between 0.25 and 0.35 μm.

Firstly, a bipolar transistor 1 is produced in a known manner, with the production of a buried layer 7, a collector zone 14, a first insulation layer 10 on the buried layer 7 and the collector zone 14, a base zone 15 on the collector zone 14, a base connection region 5, a second insulation layer 9 on the base connection region 5, and an emitter connection region 3. The emitter region, which adjoins the base region 15, is not shown.

Both the second insulation layer 9 and the first insulation layer 10 may be composed of silicon oxide or silicon nitride, for example. The first insulation layer 10 may have a thickness of a few 100 nm, preferably 100 to 600 nm, and the second insulation layer 9 may have a thickness of between 50 and 300 nm. Generally, the first insulation layer 10 is thicker than the second insulation layer 9.

The buried layer 7 typically comprises a 1 to 9 μm highly doped silicon layer, the collector zone 14 typically comprises a 100 to 1000 nm thick epitaxial silicon layer, and the base connection region 5 typically comprises a 50 to 300 nm thick highly doped polysilicon layer.

Figure 8:
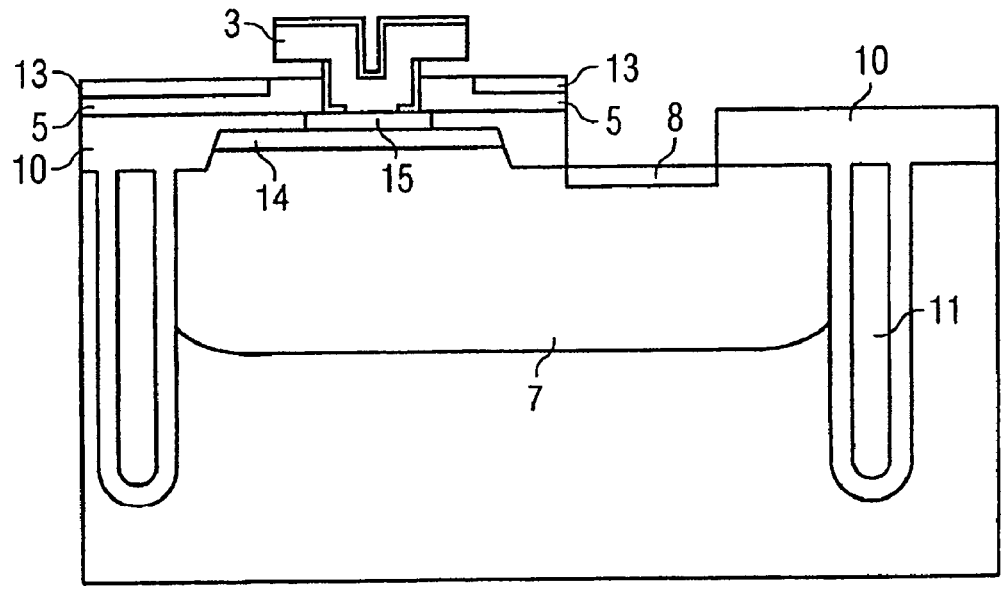
FIG. 8 shows a schematic cross-sectional view of a bipolar transistor according to the invention after the etching of the insulation layers and after the formation of a silicide region.

In the method, as shown with reference to FIG. 8, the first insulation layer 10 is removed above the buried layer 7. Hydrofluoric acid is used if the first insulation layer 10 is silicon oxide and phosphoric acid is used if the first insulation layer 10 is silicon nitride. This etching takes place in a self-aligned manner with respect to the base connection region 5. In order to avoid an undesirable incipient etching of other chip regions during these etchings, the etchings may be effected with the aid of a mask. The mask may be made of resist, for example, and covers regions in which etching is not intended to be effected. Thus, in this embodiment, only the regions which are intended to be silicided in a subsequent method step are left free.

The etching is usually effected wet-chemically on account of the high selectivity. In principle, however, it is also possible to use dry-chemical etching methods.

In the embodiment shown, only the first insulation layer 10 is removed completely as far as the buried layer 7 in order to produce a silicide region 8 in the buried layer 7. In other embodiments, the buried layer 7 under the removed first insulation layer 10 may also be partially removed.

For the production of the silicide region 8, it is possible, by way of example, either to apply a metal directly (e.g. with the aid of sputtering) and to convert the surface of the buried layer 7 and of the metal into a silicide, or to apply a silicide directly. The thickness of such a silicide region 8 is typically in the range of between 10 and 200 nm, 100 nm in one particular example.

If, besides the buried layer 7, the base connection region 5 is also additionally intended to be silicided, the second insulation layer 9 is likewise removed. If the second insulation layer 9 and the first insulation layer 10 are composed of the same material, then the etching time may not increase since the first insulation layer 10 is generally thicker than the second insulation layer 9. If the insulation layers 9 and 10 are composed of different materials, after the etching of the second insulation layer 9 the etchant is changed for the removal of the first insulation layer 10.

Both the second insulation layer 9 and the first insulation layer 10 may in each case be constructed from multiple layers of different materials. The etchings are then performed such that at least all of the layers of the insulation layers 9 and 10 in the regions desired are removed.

The method described above has the effect that the buried layer 7 is silicided in a self-aligned manner with respect to the base connection region 5. The silicide region 8 on the buried layer 7 is thereby arranged on a gradient aligned with respect to the outer boundary of the base connection region 5, that is to say that the silicide region 8 directly adjoins the base connection region 5 in a plan view, as can be seen from FIGS. 5 and 6. Particularly small dimensions of the bipolar transistor 1 are thereby possible, smaller than those produced by means of photolithography. Self-alignment also permits symmetrical construction of the bipolar transistor 1 and incurs lower costs than in the case of aligned methods, since no lithography is required.

Afterward, the bipolar transistor 1 is completed in the customary manner, that is to say that a dielectric is deposited which covers the entire bipolar transistor 1. Afterward, metal contacts, the emitter contact, the base contact and the collector contact, are produced and metallization planes are deposited.

The method described above can be employed both for self-aligned double polysilicon transistors, polytransistors, or aligned transistors. Self-aligned double polysilicon transistors polytransistors are transistors in which the emitter and base connection regions are in each case composed of polysilicon and are self-aligned with respect to one another.

Thus, during fabrication of transistor, the first insulation layer is removed, at least partly, as far as the buried layer. Directly before the production of an emitter contact, of a base contact and of a collector contact, a silicide region is made available on the buried layer. The silicide region is formed such that the collector contact is connected to the collector zone in a low-impedance manner. This makes it possible, without additional process complexity, to produce a high-frequency bipolar transistor which uses a small space and has a low collector resistance, and hence a high transition frequency.

In contrast to known methods, such as the so-called buried metal method, in which the buried layer is silicided directly after it has been produced or is completely composed of metal, the buried layer is not silicided until after the bipolar transistor has been completely finished, directly prior to the beginning of the production of the contacts (of the electrodes). This avoids the application of metal while the transistor is actually being produced, and hence also metal contaminations which make such a process implementation incompatible and unsuitable for present-day transistor production methods.

In summary, a small high-frequency bipolar transistor having a low collector resistance is presented. The transistor has low power consumption and a high transition frequency. Moreover, a method has been presented which makes it possible to produce a high-frequency bipolar transistor having the properties mentioned above, without additional process complexity.

In comparison with known bipolar transistors using the same space, the high-frequency bipolar transistor according to the invention has a lower collector resistance and hence a better transistor performance, such as a higher transition frequency, shorter gate delay times, or a lower power consumption of integrated circuits. The production costs are comparable in this case.

In comparison with known high-frequency bipolar transistors with an annularly connected collector, the high-frequency bipolar transistor according to the invention exhibits similarly fast transition frequencies, but with significantly lower production costs on account of the smaller space, and a lower power consumption on account of the smaller collector-substrate capacitance.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A high-frequency bipolar transistor comprising:
an emitter contact electrically connected to an emitter connection region;
a base contact electrically connected to a base connection region, the base connection region being an electrically conductive material, the base connection region is silicided;
a collector contact electrically connected to a collector connection region, the collector connection region including a buried layer, the buried layer electrically connecting the collector contact to a collector zone;
a silicide region provided on the buried layer, the silicide region electrically connecting the collector contact to the collector zone; and
wherein the silicide region is self aligned with respect to the base connection region and a footprint of the silicide region adjoins a footprint of the silicided base connection region.

2. The bipolar transistor as claimed in claim 1, wherein the silicide region has a thickness in the range of between 10 and 200 nm.

3. The bipolar transistor as claimed in claim 1, wherein the silicide region contains at least one transition metal.

4. The bipolar transistor as claimed in claim 1, wherein a width of overlap between the collector contact and the silicide region is less than a width of the collector contact.

5. The bipolar transistor as claimed in claim 1, wherein the silicide region does not extend to a side of the collector contact which is farther from the base connection region than an opposing side of the collector contact.

6. A high-frequency bipolar transistor comprising:
an emitter contact electrically connected to an emitter connection region, the base connection region being an electrically conductive material;
a base contact electrically connected to a base connection region, the base connection region is silicided;
a collector contact electrically connected to a collector connection region, the collector connection region including a buried layer, the buried layer electrically connecting the collector contact to a collector zone;
a silicide region provided on the buried layer, the silicide region electrically connecting the collector contact to the collector zone;
wherein the silicide region is self aligned with respect to the base connection region and a footprint of the silicide region adjoins a footprint of the silicided base connection region; and
wherein the silicide region covers the entire buried layer other than that on which the base connection region or a base zone or a first insulation layer are disposed.

7. The bipolar transistor as claimed in claim 1, wherein the collector contact is disposed on only a single side of the bipolar transistor.

8. The bipolar transistor as claimed in claim 1, wherein the silicide region extends to an end side of the buried layer.

9. A high-frequency bipolar transistor comprising:
an emitter contact electrically connected to an emitter connection region, the base connection region being an electrically conductive material;
a base contact electrically connected to a base connection region, the base connection region being silicided;
a collector contact electrically connected to a collector connection region, the collector connection region including a buried layer, the buried layer electrically connecting the collector contact to a collector zone;
a silicide region provided on the buried layer, the silicide region electrically connecting the collector contact to the collector zone; and wherein the silicide region extends around the base connection region, wherein a footprint of the silicide region adjoins a footprint of the silicided base connection region.

10. The bipolar transistor as claimed in claim 9, wherein a width of overlap between the collector contact and the silicide region is less than a width of the collector contact.

11. The bipolar transistor as claimed in claim 9, wherein the silicide region does not extend to a side of the collector contact which is farther from the base connection region than an opposing side of the collector contact.

12. A high-frequency bipolar transistor comprising:
- an emitter contact electrically connected to an emitter connection region, the base connection region being an electrically conductive material;
- a base contact electrically connected to a base connection region, the base region being silicided;
- a collector contact electrically connected to a collector connection region, the collector connection region including a buried layer, the buried layer electrically connecting the collector contact to a collector zone;
- a silicide region provided on the buried layer, the silicide region electrically connecting the collector contact to the collector zone; and
- wherein the silicide region extends around the base connection region;
- wherein the silicide region covers the entire buried layer other than that on which the base connection region or a base zone or a first insulation layer are disposed; and
- a footprint of the silicided base connection region adjoins a footprint of the silicide region.

* * * * *